United States Patent
Liu et al.

(10) Patent No.: US 11,606,075 B2
(45) Date of Patent: Mar. 14, 2023

(54) TUNABLE, BROADBAND DIRECTIONAL COUPLER CIRCUITS EMPLOYING AN ADDITIONAL, SELECTABLE COUPLING CIRCUIT(S) FOR CONTROLLING FREQUENCY RESPONSE

(71) Applicant: QUALCOMM Incorporated, San Diego, CA (US)

(72) Inventors: Yu-Chun Liu, Altamonte Springs, FL (US); Xiaomin Yang, Longwood, FL (US); Arjun Ravindran, Orlando, FL (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/210,296

(22) Filed: Mar. 23, 2021

(65) Prior Publication Data

US 2022/0311408 A1   Sep. 29, 2022

(51) Int. Cl.
*H01P 5/18*   (2006.01)
*H03H 7/48*   (2006.01)

(52) U.S. Cl.
CPC ............... *H03H 7/48* (2013.01); *H01P 5/18* (2013.01)

(58) Field of Classification Search
CPC . H01P 5/18; H01P 5/182; H01P 5/184; H03H 7/48
See application file for complete search history.

(56) References Cited

U.S. PATENT DOCUMENTS

| | | | | |
|---|---|---|---|---|
| 5,363,071 | A | * 11/1994 | Schwent | ............... H01P 5/04 333/17.1 |
| 8,558,640 | B2 | * 10/2013 | Hirai | ............... H01P 5/185 333/116 |
| 2014/0152396 | A1 | 6/2014 | Fackelmeier et al. | |
| 2016/0172737 | A1 | 6/2016 | Srirattana et al. | |
| 2016/0268994 | A1 | 9/2016 | Granger-Jones et al. | |
| 2020/0365964 | A1 | 11/2020 | Tokuda et al. | |

OTHER PUBLICATIONS

International Search Report and Written Opinion for International Patent Application No. PCT/US2022/070862, dated Jun. 22, 2022, 14 pages.

* cited by examiner

*Primary Examiner* — Stephen E. Jones
(74) *Attorney, Agent, or Firm* — W&T

(57) ABSTRACT

Tunable, broadband directional coupler circuits employing one or more additional, switchable coupling circuits for controlling frequency response, and related methods. In exemplary aspects, the directional coupler includes one or more additional coupling circuits that each include an additional coupling line located adjacent to the primary coupling line and that can be selectively activated to change a frequency response of the directional coupler. When an additional coupling circuit is activated, its additional coupling line has the effect of extending the length of the primary coupling line through mutual inductance, thus changing the coupling frequency response of the directional coupler. The additional coupling circuit includes one or more switch(es) to allow for the selective coupling of its additional coupling line to the coupling and/or isolation ports of the directional coupler to selectively change and control the frequency response of the primary coupling line.

32 Claims, 10 Drawing Sheets

| MODE | S5 | S6 | S7 | S8 | FREQ |
|------|-----|-----|-----|-----|------|
| 1 | OFF | OFF | OFF | OFF | #1 |
| 2 | ON | OFF | OFF | OFF | #2 |
| 3 | OFF | ON | OFF | OFF | #3 |
| 4 | OFF | OFF | ON | OFF | #4 |
| 5 | ON | OFF | ON | OFF | #5 |
| 6 | OFF | ON | ON | OFF | #6 |
| 7 | OFF | OFF | OFF | ON | #7 |
| 8 | ON | OFF | OFF | ON | #8 |
| 9 | OFF | ON | OFF | ON | #9 |

FIG. 8

TUNABLE, BROADBAND DIRECTIONAL COUPLER CIRCUITS EMPLOYING AN ADDITIONAL, SELECTABLE COUPLING CIRCUIT(S) FOR CONTROLLING FREQUENCY RESPONSE

BACKGROUND

I. Field of the Disclosure

The field of the disclosure relates to directional couplers, and more particularly to use of directional couplers to couple power from a radio frequency (RF) signal as a representative signal to be supplied to another circuit for a desired application.

II. Background

A radio frequency (RF) transmit circuit chain conventionally includes an RF power amplifier (PA) to amplify a RF signal for transmission as an output RF signal within a given frequency band. It may be desired to detect the output power in the output RF signal. For example, the detected output power may be used to adjust the gain of the PA to control the output power in the output RF signal within a given output power level or range. In this regard, a directional coupler can be provided and coupled to the transmission line of the RF transmit circuit chain to detect the output power of the output RF signal. A directional coupler is a passive electrical device that couples power of a signal transmitted in a transmission line to a port enabling a representation of the coupled signal to be supplied to another circuit for a desired application. In this example, the directional coupler is coupled to the transmission line on the output side of the RF PA to sample the output RF signal from the RF PA and pass the sampled output RF signal to a power detector. The power detector can be configured to generate a control signal based on the detected power in the output RF signal to adjust the gain of the RF PA.

Directional couplers have an operational frequency response (i.e., frequency range) according to their design. The operational frequency response of a directional coupler is defined as the frequency range of signals that the directional coupler can couple on its coupled output port at a given minimum specified coupling power. For example, a directional coupler may be capable of coupling an RF signal at a minimum power level of 20 decibel (dB) in a limited frequency range between 100-1600 MegaHertz (MHz). It may be desired to provide a directional coupler that has a larger bandwidth for a desired application. For example, in $5^{th}$ Generation (5G) new radio (NR) (5G-NR) mobile network applications, multiple feedback receive paths whose power needs to be measured may be present across a broad range of frequencies.

SUMMARY OF THE DISCLOSURE

Aspects disclosed herein include tunable, broadband directional coupler circuits employing one or more additional, switchable coupling circuits for controlling frequency response. Related methods are also disclosed. The directional coupler circuit includes a directional coupler that has a main transmission line coupled between an input port and output port. The main transmission line is configured to transmit a received radio frequency (RF) signal received on the input port, to the output port. The directional coupler also includes a primary coupling line adjacent to the main transmission line and coupled between an isolation port and a coupling port. The primary coupling line couples a portion of the electromagnetic (EM) power of the RF signal on the primary coupling line onto an additional coupling line(s). In exemplary aspects, to allow the frequency response of the directional coupler to be selectively tuned, the directional coupler circuit includes one or more additional coupling circuits. Each additional coupling circuit includes a respective coupling line located adjacent to the primary coupling line. When an additional coupling circuit is activated, its additional coupling line has the effect of extending the length of the primary coupling line through mutual inductance between the primary coupling line and the additional coupling line. This changes the coupling frequency response on the coupling port of the directional coupler. In one exemplary aspect, the additional coupling circuit includes a coupling port switch coupled between its additional coupling line and the coupling port. In another exemplary aspect, the additional coupling circuit includes an isolation port switch coupled between its additional coupling line and the isolation port. These coupling port and/or isolation port switches can be selectively activated in various combinations to activate a respective additional coupling circuit in the directional coupler to change the frequency response of the coupling port. Thus, the frequency response of the directional coupler can be tuned and changed to a variety of different frequency ranges to achieve an overall broader frequency response capability.

In one exemplary aspect, a directional coupler circuit is provided. The directional coupler circuit includes a main transmission line coupled between an input port and an output port. The directional coupler circuit also includes a primary coupling circuit comprising a primary coupling line adjacent to the main transmission line. The directional coupler circuit also includes an additional coupling circuit. The additional coupling circuit includes an additional coupling line comprising a first end and a second end, the additional coupling line adjacent to the primary coupling line.

In another exemplary aspect, a method of selectively tuning the frequency response of a directional coupler is provided. The method includes receiving an input RF signal on an input port coupled to a main transmission line. The method also includes transmitting the received input RF signal on the main transmission line to an output port. The method also includes coupling a portion of power of the input RF signal as a coupled RF signal from the main transmission line to a primary coupling line adjacent to the main transmission line to provide a primary coupled RF signal of a primary frequency response. The method also includes activating an additional coupling line adjacent to the primary coupling line to couple a portion of the coupled RF signal to the additional coupling line to provide an additional coupled RF signal of a second frequency response different from the primary frequency response.

In another exemplary aspect, a RF transmit circuit is provided. The RF transmit circuit includes a power amplifier (PA) circuit. The PA circuit includes a PA input configured to receive an input RF signal, and a PA output. The PA circuit is configured to amplify the input RF signal into an amplified RF signal on the PA output. The RF transmit circuit also includes a matching network circuit. The matching network circuit comprises a matching network input coupled to the PA output, and a matching network output. The RF transmit circuit also includes a directional coupler circuit. The directional coupler circuit includes a coupler input port coupled to the matching network output, a coupler output port, and a main transmission line coupled to the coupler input port and the coupler output port. The directional coupler circuit also includes a primary coupling circuit comprising a primary coupling line adjacent to the main transmission line. The directional coupler circuit also includes an additional coupling circuit. The additional coupling circuit includes an additional coupling line comprising a first end and a second end, wherein the additional coupling line is adjacent to the main transmission line. The additional coupling circuit also includes an additional coupling port switch coupled to the first end of the additional coupling line and a coupling output. The additional coupling circuit also includes an additional isolation port switch coupled to the second end of the additional coupling line and an isolation output.

BRIEF DESCRIPTION OF THE FIGURES

FIG. 8 is a table illustrating exemplary operational modes for controlling the activation of the primary and multiple additional coupling circuits in the directional coupler in FIG. 7 to selectively tune the frequency response of the directional coupler;

DETAILED DESCRIPTION

Figure 1:
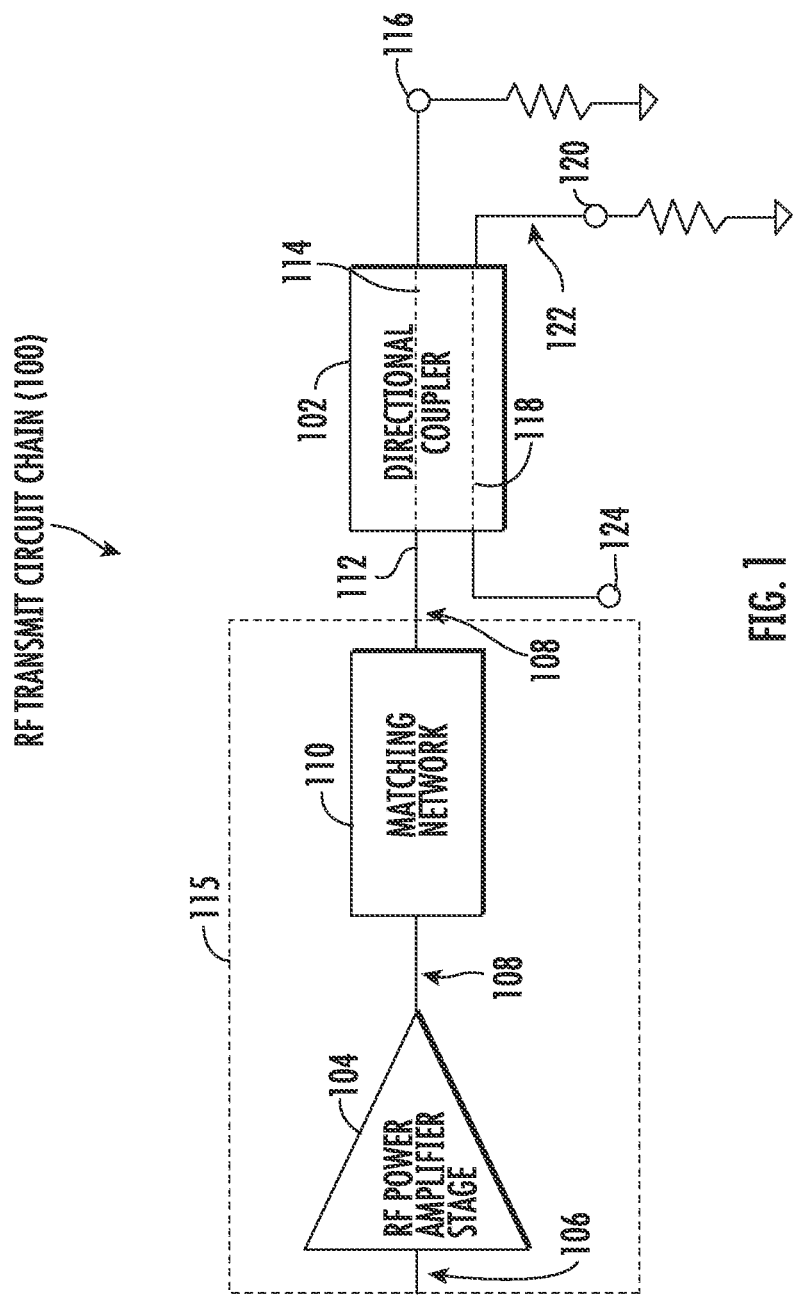
FIG. 1 is a schematic diagram of a radio frequency (RF) transmit circuit chain employing a directional coupler to couple power from an output RF signal.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include tunable, broadband directional coupler circuits employing one or more additional, switchable coupling circuits for controlling frequency response. Related methods are also disclosed. The directional coupler circuit includes a directional coupler that has a main transmission line coupled between an input port and output port. The main transmission line is configured to transmit a received radio frequency (RF) signal received on the input port, to the output port. The directional coupler also includes a primary coupling line adjacent to the main transmission line and coupled between an isolation port and a coupling port. The primary coupling line couples a portion of the electromagnetic (EM) power of the RF signal on the primary coupling line onto an additional coupling line(s). In exemplary aspects, to allow the frequency response of the directional coupler to be selectively tuned, the directional coupler circuit includes one or more additional coupling circuits. Each additional coupling circuit includes a respective coupling line located adjacent to the primary coupling line. When an additional coupling circuit is activated, its additional coupling line has the effect of extending the length of the primary coupling line through mutual inductance between the primary coupling line and the additional coupling line. This changes the coupling frequency response on the coupling port of the directional coupler. In one exemplary aspect, the additional coupling circuit includes a coupling port switch coupled between its additional coupling line and the coupling port. In another exemplary aspect, the additional coupling circuit includes an isolation port switch coupled between its additional coupling line and the isolation port. These coupling port and/or isolation port switches can be selectively activated in various combinations to activate a respective additional coupling circuit in the directional coupler to change the frequency response of the coupling port. Thus, the frequency response of the directional coupler can be tuned and changed to a variety of different frequency ranges to achieve an overall broader frequency response capability.

In this regard, FIG. 1 illustrates an exemplary RF transmit circuit 100 that employs a directional coupler 102 configured to couple power from an output RF signal amplified by a power amplifier (PA) circuit 104. In this regard, the PA circuit 104 is an amplifier circuit that is configured to amplify a received input RF signal 106 into an output RF signal 108. The output RF signal 108 can be coupled to a matching network 110 to provide an impedance matching between the output 112 of the PA circuit 104 and a main transmission line 114 carrying the output RF signal 108 to another destination circuit. For example, the PA circuit 104 and matching network 110 may be part of a RF front end circuit 115 that is provided in a communication device, such as a mobile cellular phone device. The RF front end circuit 115 may be coupled to an antenna (not shown) that receives the input RF signal 106 and couples the input RF signal 106 to the PA circuit 104 to be amplified.

To sample a portion of the output RF signal 108 to be provided to another circuit for analysis, such as for power measurement and amplifier feedback, the RF transmit circuit 100 in FIG. 1 also includes the directional coupler 102. The directional coupler 102 is a passive electrical device that couples power of the output RF signal 108 in the main transmission line 114 to an output port 116. The directional coupler 102 also includes a primary coupling line 118 that is located adjacent to the main transmission line 114 to electromagnetically couple a portion of the power of the output RF signal 108 to a coupling port 120 as a coupled RF signal 122. The directional coupler 102 also includes an isolation port 124. The directional coupler 102 can be configured in a forward mode for the coupled RF signal 122 to be supplied to the coupling port 120 or a reverse mode for the coupled RF signal 122 to be supplied to the isolation port 124.

The directional coupler 102 in FIG. 1 has an operational frequency response (i.e., frequency range) according to its design. The length of the primary coupling line 118 in this example is a quarter-wave long at the center frequency of the frequency response of the directional coupler 102. The operational frequency response of a directional coupler is defined as the frequency range of signals centered at its center frequency that the directional coupler 102 can couple the output RF signal 108 at a given minimum specified coupling power. For example, it may be desired for the directional coupler 102 to be capable of coupling the output RF signal 108 at a minimum power level of 20 decibel (dB) in a limited frequency range between 100-2600 MegaHertz (MHz) for 5$^{th}$ Generation (5G) new radio (NR) (5G-NR) mobile network applications, for example. However, the frequency response of the primary coupling line 118 may not provide this desired frequency response.

Figure 2:
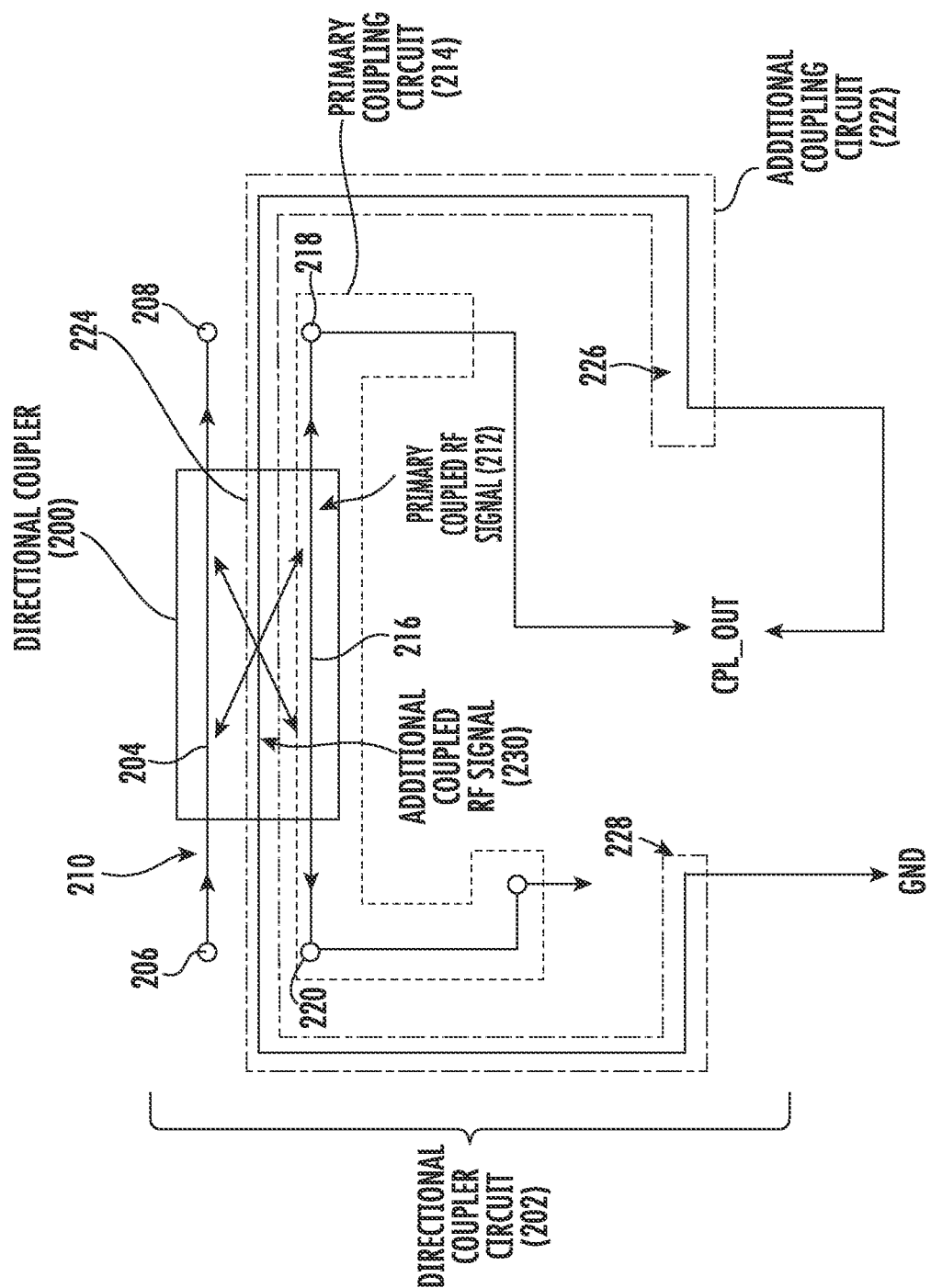
FIG. 2 is a schematic diagram of an exemplary tunable, broadband directional coupler circuit employing an additional coupling circuit for controlling a frequency response of the directional coupler.

In this regard, FIG. 2 is a schematic diagram of an exemplary tunable, broadband directional coupler 200 that is capable of providing a coupled RF output signal having an expanded frequency response. The directional coupler 200 is provided as part of a directional coupler circuit 202 in this example. The directional coupler 200 includes a main transmission line 204 that is coupled between an input port 206 and an output port 208. The input port 206 is configured to receive an input RF signal 210. The main transmission line 204 couples the input RF signal 210 to the output port 208. To generate a primary coupled RF signal 212 of the input RF signal 210, the directional coupler 200 also includes a primary coupling circuit 214. The primary coupling circuit 214 includes a primary coupling line 216, which is a transmission line, located adjacent to the main transmission line 204. The primary coupling line 216 is located close enough to the main transmission line 204 such that the EM field generated as a result of the input RF signal 210 passing through the main transmission line 204 induces a current on the primary coupling line 216. The current induced on the primary coupling line 216 is a representation of the input RF signal 210, but at a portion of the power of the input RF signal 210 as the primary coupled RF signal 212. The primary coupled RF signal 212 can be provided over the primary coupling line 216 to a coupling port 218 or an isolation port 220 depending on whether the directional coupler 200 is control led to operate in a forward or reverse mode, respectively. In this example in FIG. 2, the directional coupler 200 is shown as operating in a forward mode.

The primary coupling circuit 214 has a primary frequency response. The center frequency of the primary frequency response of the primary coupling circuit 214 depends on the length of the primary coupling line 216. The primary frequency response of the primary coupling line 216 also controls the frequency bandwidth of the input RF signal 210 that can be coupled in the primary coupled RF signal 212 at a given power level. The primary frequency response of the primary coupling circuit 214 is the coupling frequency response of the directional coupler 200. The primary frequency response of the directional coupler 200 may not cover the desired frequency range of desired input RF signals 210 based on the frequency response of the primary coupling circuit 214 therein. For example, the primary coupling circuit 214 of the directional coupler 200 in FIG. 2 may be capable of coupling an input RF signal 210 at a minimum power level of 20 dB in a limited frequency range between 100-1600 MHz. However, it may be desired for the directional coupler 200 to have larger bandwidth frequency response for a desired application. For example, in 5G-NR mobile network applications, multiple feedback receive paths whose power needs to be measured may be present across a broad range of frequencies, such as between 100-2300 MHz.

In this regard, to change the frequency bandwidth and frequency response of the directional coupler 200 in FIG. 2, the directional coupler 200 includes an additional coupling circuit 222 in this example. The additional coupling circuit 222 includes an additional coupling line 224 comprising a first end 226 coupled to the coupling port 218 and a second end 228 coupled to the isolation port 220. The additional coupling line 224 is located adjacent to the primary coupling line 216. The additional coupling line 224 is located close enough to the primary coupling line 216 such that the EM field generated as a result of the primary coupled RF signal 212 coupled on the primary coupling line 216 induces a current on the additional coupling line 224. The current induced on the additional coupling line 224 is a representation of the primary coupled RF signal 212, but at a portion of the power of the primary coupled RF signal 212 as an additional coupled RF signal 230. The additional coupling line 224 has the effect of extending the length of the primary coupling line 216 through mutual inductance between the primary coupling line 216 and the additional coupling line 224. This changes the coupling frequency response on the coupling port 218 of the directional coupler 200 to a second frequency response. Thus, the additional coupling circuit 222 allows the frequency response of the directional coupler 200 to be changed to be responsive to the input RF signal 210 in a different, second frequency range that would otherwise be responsive if only the primary coupling line 216 were present and active to achieve a different frequency response capability from the primary frequency response.

It may also be desired to provide for the ability of the frequency response of the directional coupler 200 in FIG. 2 to be selectively tuned. For example, if the additional coupling circuit 222 was not coupled to the coupling port 218 or isolation port 220 of the directional coupler 200, the frequency response of the directional coupler 200 on the coupling port 218 would be based on the coupling of power of the input RF signal 210 onto the primary coupling line 216 itself. However, if the additional coupling circuit 222 was coupled to the coupling port 218 or isolation port 220 of the directional coupler 200, the frequency response of the directional coupler 200 on the coupling port 218 would be based on the coupling of power of the input RF signal 210 onto the primary coupling line 216 and its coupling through mutual inductance to the additional coupling line 224 of the additional coupling circuit 222.

Figures 3, 4:
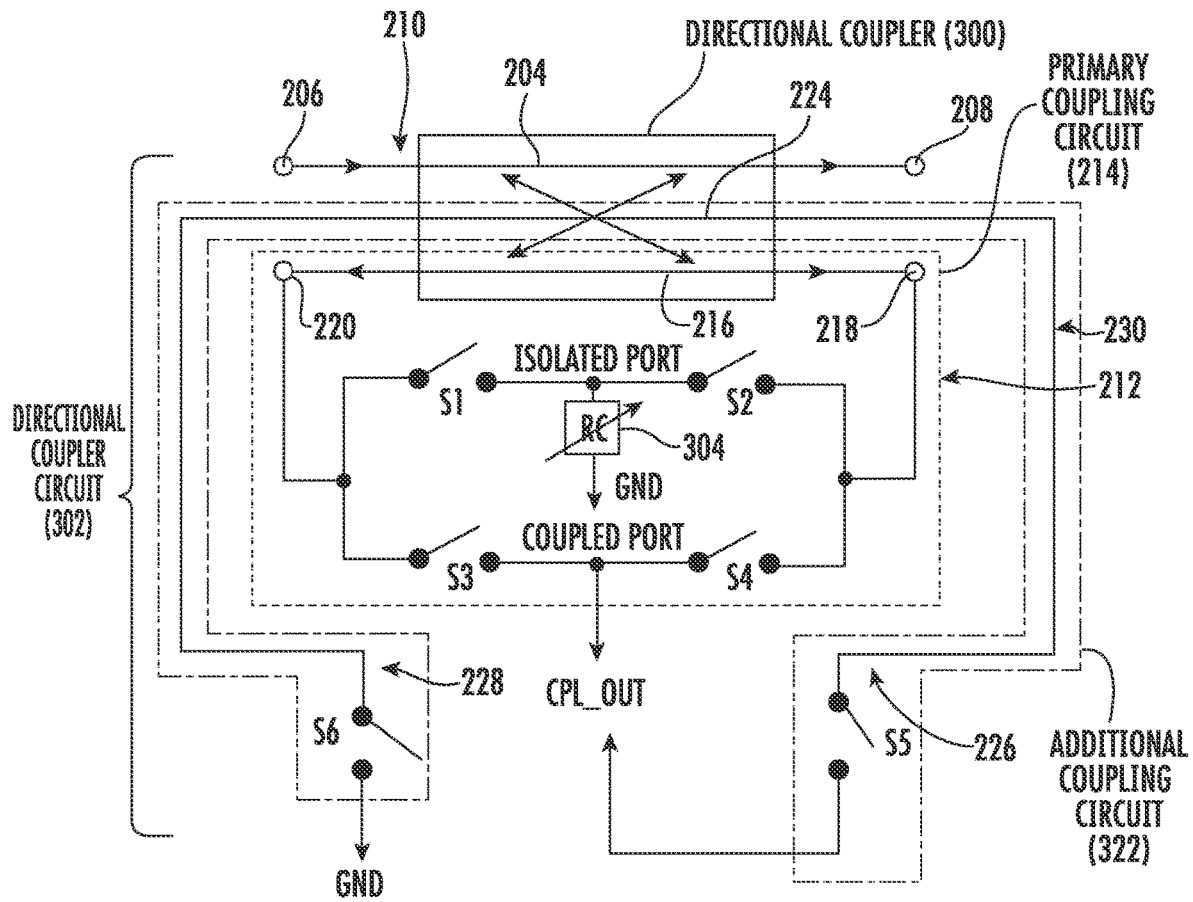
FIG. 3 is a schematic diagram of another exemplary tunable, broadband directional coupler circuit employing an additional, switchable coupling circuit for controlling the frequency response of the directional coupler.
FIG. 4 is a table illustrating exemplary operational modes for controlling the activation of the primary and additional coupling circuits in the directional coupler in FIG. 3 to allow for selectively tuning the frequency response of the directional coupler.

In this regard, FIG. 3 is a schematic diagram of another directional coupler 300 in a directional coupler circuit 302, wherein the directional coupler 300 is similar to the directional coupler 200 in FIG. 2. The directional coupler circuit 302 and its directional coupler 300 in FIG. 3 include an alternative additional coupling circuit 322 similar to the additional coupling circuit 222 in FIG. 2. However, as discussed in more detail below, the additional coupling circuit 322 in FIG. 3 includes additional, switchable coupling and isolation port switches S5, S6 that can be activated (i.e., closed), or deactivated (i.e., open) to control whether the additional coupling circuit 322, and more specifically, its additional coupling line 224 is coupled and electrically active in the directional coupler circuit 302. This allows for the frequency response of the directional coupler 300 to be tunable between the inclusion or absence of the additional coupling circuit 322 in the directional coupler circuit 302. In this manner, the directional coupler 300 can be configured to provide a broader band frequency response. As also discussed in more detail below, the directional coupler circuit 302 also includes first and second primary coupling port switches S4, S3 and first and second primary isolation port switches S1, S2 to control whether the directional coupler 300 is put in a forward or reverse operating mode between the coupling port 218 and the isolation port 220.

In this regard, as illustrated in FIG. 3, the additional coupling circuit 322 includes the additional coupling line 224 like the additional coupling circuit 222 in FIG. 2. Common components between the directional coupler circuit 202 in FIG. 2 and the directional coupler circuit 302 in FIG. 3 are shown with common element numbers and thus are not re-described. The additional coupling circuit 322 includes the additional coupling port switch S5 that is coupled to the first end 226 of the additional coupling line 224 and a coupling output CPL_OUT. The additional coupling circuit 322 also includes the additional isolation port switch S6 that is coupled to the second end 228 of the additional coupling line 224 and an isolation output GND, which is a ground node in this example. The additional coupling port switch S5 is configured to be activated (i.e., closed) to couple the first end 226 of the additional coupling line 224 to the coupling output CPL_OUT to cause the directional coupler 300 and the primary coupled RF signal 212 to be of a second frequency response different from the primary frequency response if the additional coupling circuit 322 was not actively included in the directional coupler circuit 302 and coupled to the coupling output CPL_OUT. When the additional coupling port switch S5 is activated, the additional coupling line 224 is EM coupled to the primary coupling line 216 to cause the primary coupled RF signal 212 to have a second frequency response different from the primary frequency response. The EM coupling of the additional coupling line 224 to the primary coupling line 216 in effect lengthens the primary coupling line 216 and thus its wavelength responsiveness.

Figure 5:
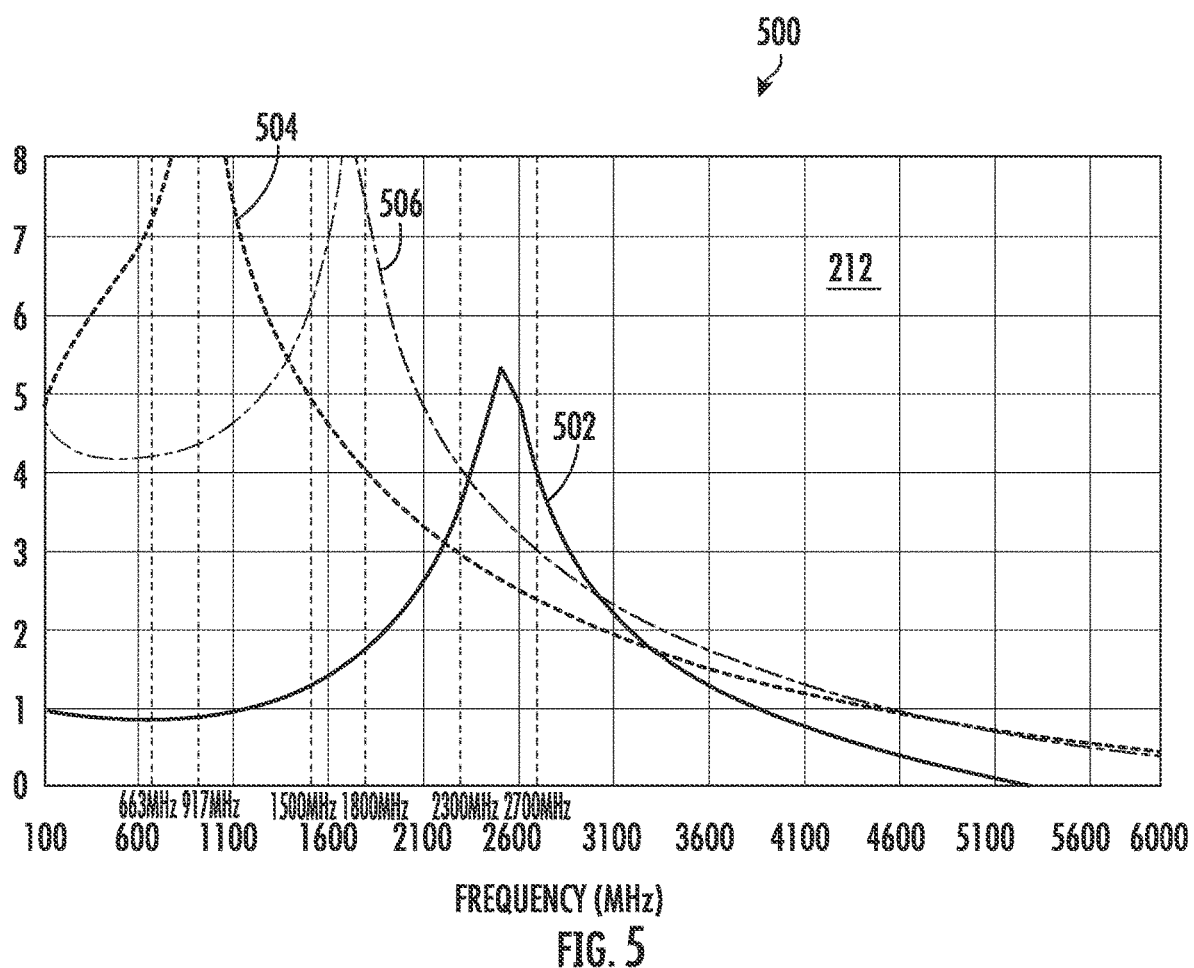
FIG. 5 is a graph illustrating different exemplary frequency responses of the directional coupler in FIG. 3 based on the different operational modes of the directional coupler.

This is further shown in table 400 in FIG. 4 illustrating exemplary operational modes for controlling the activation of the primary and additional coupling circuits 214, 322 in the directional coupler 300 in FIG. 3 to allow for selectively tuning the frequency response of the directional coupler. As shown in table 400, when the additional coupling port switch S5 is activated (closed or "ON") and the additional isolation port switch S6 is deactivated (open or "OFF"), the directional coupler 300 has the second frequency response (#2) in mode 2. This is shown in frequency response curve 502 in graph 500 in FIG. 5 that graphs the power level of the primary coupled RF signal 212 in the Y-axis as a function of frequency (f) in the X-axis. As shown in FIG. 5, the frequency response of the primary coupled RF signal 212 in mode 2 above a power level of '4' is 2300 to 2700 MHz. This is different from the first frequency response (#1) in mode 1 as shown in the table 400 in FIG. 4 if both the additional coupling port switch S5 and additional isolation port switch S6 were not activated to provide the additional coupling circuit 322 in the directional coupler circuit 302. The first frequency response for mode 1 of the directional coupler 300 is shown in frequency response curve 504 in the graph 500 in FIG. 5 illustrating a frequency response of the primary coupled RF signal 212 in mode 1 above a power level of '4' between 663 and 917 MHz.

Similarly, the additional isolation port switch S6 is configured to be activated (i.e., closed) to couple the second end 228 of the additional coupling line 224 to the isolation output GND to cause the directional coupler 300 and the primary coupled RF signal 212 to be of a different, third frequency response different from the primary frequency response if the additional coupling circuit 322 was not actively included in the directional coupler circuit 302 and coupled to the isolation output GND. When the additional isolation port switch S6 is activated, the additional coupling line 224 is EM coupled to the primary coupling line 216 to cause the primary coupled RF signal 212 to have a third frequency response different from the primary frequency response. The EM coupling of the additional coupling line 224 to the primary coupling line 216 in effect lengthens the primary coupling line 216 and thus its wavelength responsiveness. Coupling the additional coupling line 224 to the isolation output GND changes the frequency response of the directional coupler 300 to a third frequency response different from the second frequency response if the additional coupling line 224 was coupled to the coupling output CPL_OUT.

This is further shown in the table 400 in FIG. 4 illustrating exemplary operational modes for controlling the activation of the primary and additional coupling circuits 214, 322 in the directional coupler 300 in FIG. 3 to allow for selectively tuning the frequency response of the directional coupler 300. As shown in table 400, when the additional isolation port switch S6 is activated (closed or "ON") and the additional coupling port switch S5 is deactivated (open or "OFF"), the directional coupler 300 has the third frequency response (#3) in mode 3. The third frequency response for mode 3 of the directional coupler 300 is shown in frequency response curve 506 in the graph 500 in FIG. 5. Therein, the third frequency response of the primary coupled RF signal 212 in mode 3 above a power level of '4' is between 1500 and 1800 MHz. This is different from the first frequency response (#1) in mode 1 as shown in the table 400 in FIG. 4 if both the additional coupling port switch S5 and additional isolation port switch S6 were not activated to provide the additional coupling circuit 322 in the directional coupler circuit 302. As stated above, in this example, the first frequency response of the directional coupler 300 is shown in frequency response curve 502 in the graph 500 in FIG. 5 illustrating a frequency response of the primary coupled RF signal 212 in mode 1 above a power level of '4' between 663 MHz and 917 MHz.

It may also be desired to control the forward or reverse operation of the directional coupler 300 as to the direction of the primary coupled RF signal 212 to the coupling port 218 or isolation port 220, respectively. In this regard, the primary coupling circuit 214 includes additional switches S1-S4 as shown in FIG. 3 that control the forward or reverse operation of the directional coupler 300. And further, as discussed above, activation and deactivation of the additional coupling port and additional isolation port switches S5, S6 control the frequency response modes 1-3 of the directional coupler 300. The primary coupling circuit 214 includes a first primary coupling port switch S4 coupled to the first end 226 of the primary coupling line 216 and the coupling output CPL_OUT. The primary coupling circuit 214 also includes a first primary isolation port switch S1 coupled to the second end 228 of the primary coupling line 216 and the isolation output GND. The primary coupling circuit 214 also includes a second primary coupling port switch S3 coupled to the second end 228 of the primary coupling line 216 and the coupling output CPL_OUT. The primary coupling circuit 214 also includes a second primary isolation port switch S2 coupled to the first end 226 of the primary coupling line 216 and the isolation output GND. The first primary coupling port switch S4 and first primary isolation port switch S1 are activated and deactivated together to control a forward operation mode of the directional coupler 300. The second primary coupling port switch S3 and second primary isolation port switch S2 are activated and deactivated together to control a reverse operation mode of the directional coupler 300. When the first primary coupling port switch S4 and the first primary isolation port switch S1 are activated, the second primary coupling port switch S3 and the second primary isolation port switch S2 should be deactivated and vice versa.

In a forward mode operation, the first primary coupling port switch S4 is configured to be activated to couple the first end 226 of the primary coupling line 216 to the coupling output CPL_OUT. Also, in this forward mode operation, the first primary isolation port switch S1 is configured to also be activated to couple the second end 228 of the primary coupling line 216 to the isolation output GND. In the forward mode operation, the primary coupled RF signal 212 is directed in a forward direction to the coupling output CPL_OUT. An optional RC filter circuit 304 is coupled between the second end 228 of the primary coupling line 216 and the isolation output GND to provide additional frequency isolation between the primary coupling line 216 and the isolation output GND. In a reverse mode operation, the second primary coupling port switch S3 is configured to be activated to couple the second end 228 of the primary coupling line 216 to the coupling output CPL_OUT. Also, in this reverse mode operation, the second isolation coupling port switch S2 is configured to also be activated to couple the first end. 226 of the primary coupling line 216 to the isolation output GND. In the reverse mode operation, the primary coupled RF signal 212 is directed in a reverse direction to the isolation output GND.

Figure 6:
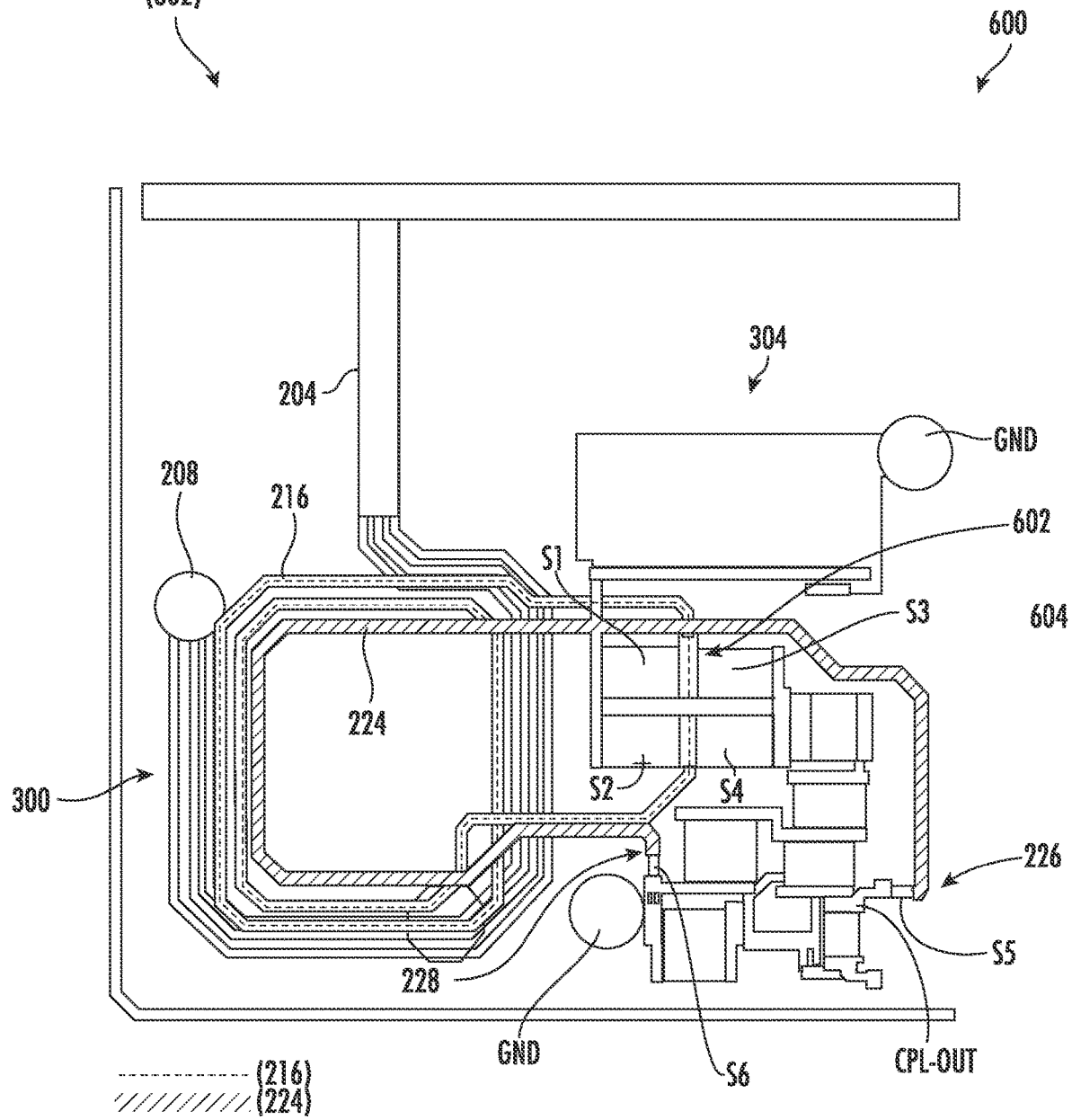
FIG. 6 is an exemplary circuit layout diagram illustrating an exemplary layout of circuit components of the directional coupler in FIG. 3.

FIG. 6 is an exemplary circuit layout 600 illustrating an exemplary layout of the directional coupler circuit 302 in FIG. 3 to further illustrate an exemplary placement of the primary coupling line 216 and the additional coupling line 224. As illustrated in FIG. 6, the primary coupling line 216 is laid out as metal lines in the form of a spiral shape that this partially located inside and adjacent to the main transmission line 204. The additional coupling line 224 is laid out as metal lines partially located inside and adjacent to the primary coupling line 216 so that there is mutual inductance coupling between the primary coupling line 216 and the additional coupling line 224. A first end 602 of the primary coupling line 216 is coupled to the first primary isolation port switch S1 and the second isolation coupling port switch S2. A second end 604 of the primary coupling line 216 is coupled to second primary coupling port switch S3 and the first primary coupling port switch S4. The first end 226 of the additional coupling line 224 is coupled to the additional coupling port switch S5, which is coupled to the coupling output CPL_OUT. The second end 228 of the additional coupling line 224 is coupled to the additional isolation port switch S6, which is coupled to the isolation output GND. As illustrated in FIG. 6, the primary coupling line 216 is laid out as metal lines in the form of a spiral shape that this partially located inside and adjacent to the main transmission line 204. The additional coupling line 224 is located adjacent to the primary coupling line 216.

Figure 7:
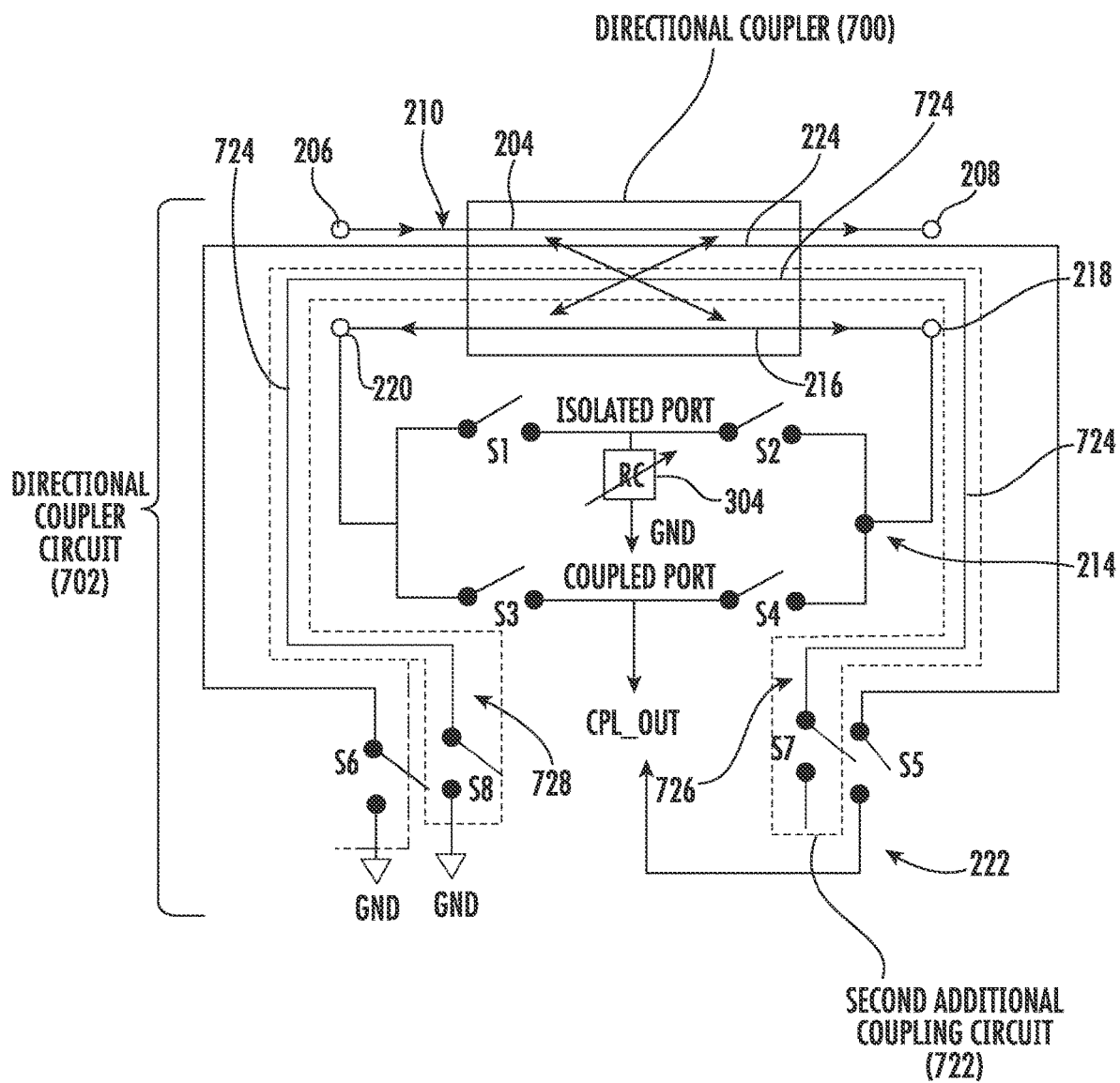
FIG. 7 is a schematic diagram of another exemplary tunable, broadband directional coupler circuit employing multiple additional, switchable coupling circuits for controlling the frequency response of the directional coupler.

It may be desired to provide additional frequency responses for the directional coupler 300 in the directional coupler circuit 302 in FIG. 3 in addition to the three frequency responses in modes 1-3 discussed above. In this regard, FIG. 7 is a schematic diagram of another exemplary tunable, broadband directional coupler 700 in a directional coupler circuit 702 employing a second additional, switchable coupling line 724 in a second additional, switchable coupling circuit 722 for controlling additional frequency responses of the directional coupler 700. The directional coupler 700 in FIG. 7 includes the primary coupling line 216 and the additional coupling line 224 as provided in the directional coupler 300 in FIG. 3. Common components between the directional coupler 700 and directional coupler circuit 702 in FIG. 7 and the directional coupler 300 and directional coupler circuit 302 in FIG. 3 are shown with common element numbers and are not re-described.

With reference to FIG. 7, the second additional coupling circuit 722 includes the second additional coupling line 724 that is located adjacent to the additional coupling line 224. The second additional coupling line 724 is configured to be EM coupled to the additional coupling line 224 to cause the primary coupled RF signal 212 to have yet other frequency responses different from the previously discussed frequency responses. The EM coupling of the second additional coupling line 724 to the additional coupling line 224 in effect lengthens the primary coupling line 216 and thus its wavelength responsiveness. The second additional coupling circuit 722 in FIG. 7 includes second additional, switchable coupling and isolation port switches S7, S8 that can be activated (i.e., closed), or deactivated (i.e., open) to control whether the second additional coupling circuit 722, and more specifically, its second additional coupling line 724 is coupled and electrically active in the directional coupler circuit 702. This allows for the frequency response of the directional coupler 700 to be further tunable between the inclusion or absence of the second additional coupling circuit 722 in the directional coupler circuit 702. In this manner, the directional coupler 700 can be configured to provide an even broader band frequency response.

The second additional coupling circuit 722 includes the second additional coupling port switch S7 that is coupled to a first end 726 of the second additional coupling line 724 and the coupling output CPL_OUT. The second additional coupling circuit 722 also includes the second additional isolation port switch S8 that is coupled to a second end 728 of the second additional coupling line 724 and the isolation output GNU. The second additional coupling port switch S7 is configured to be activated (i.e., closed) to couple the first end 726 of the second additional coupling line 724 to the coupling output CPL_OUT to cause the directional coupler 700 and the primary coupled RF signal 212 to be of yet another frequency response different from the previously discussed frequency responses if the second additional coupling circuit 722 was not actively included in the directional coupler circuit 702 and coupled to the coupled output CPL_OUT. When the second additional coupling port switch S7 is activated, the second additional coupling line 724 is EM coupled to the additional coupling line 224 and/or the primary coupling line 216 to cause the primary coupled RF signal 212 to have a different frequency response. The EM coupling of the second additional coupling line 724 to the additional coupling line 224 and/or the primary coupling line 216 in effect lengthens the primary coupling line 216 and thus its wavelength responsiveness.

This is further shown in table 800 in FIG. 8 illustrating exemplary operational modes for controlling the activation of the primary, additional, and second additional coupling circuits 214, 32.2, 722 in the directional coupler 700 in FIG.

7 to allow for selectively tuning the frequency response of the directional coupler 700. As shown in table 800, when the second additional coupling port switch S7 is activated (closed or "ON") and the second additional isolation port switch S8 is deactivated (open or "OFF"), the directional coupler 700 has the possibility of three (3) additional frequency responses (#4, #5, #6) in modes 4-6, depending on whether the additional coupling port switch S5 and additional isolation port switch S6 are activated ("ON" or "OFF").

Similarly, the second additional isolation port, switch S8 is configured to be activated (i.e., closed) to couple the second end 728 of the second additional coupling line 724 to the isolation output GND to cause the directional coupler 700 and the primary coupled RF signal 212 to be of a different frequency response if the second additional coupling circuit 722 was not actively included in the directional coupler circuit 702 and coupled to the isolation output GND. When the second additional isolation port switch S8 is activated, the second additional coupling line 724 is EM coupled to the additional coupling line 224 and/or the primary coupling line 216 to cause the primary coupled RF, signal 212 to have a different frequency response. The EM coupling of the second additional coupling line 724 to the primary coupling line 216 in effect lengthens the primary coupling line 216 and thus its wavelength responsiveness. Coupling the second additional coupling line 724 to the isolation output GND changes the frequency response of the directional coupler 700 to another frequency response different from the frequency response if second additional coupling line 724 was coupled to the coupling output CPL_OUT. This is further shown in the table 800 in FIG. 8. As shown in table 800, when the second additional isolation port switch S8 is activated (closed or "ON") and the second additional coupling port switch S7 is deactivated (open or "OFF"), the directional coupler 700 has the possibility of three (3) additional frequency responses (#7, #8, #9) in modes 7-9, depending on whether the additional coupling port switch S5 and additional isolation port switch S6 are activated ("ON" or "OFF").

Each of the additional and second additional coupling port switches S5, S7 and additional and second additional isolation port switches S6, S8 can be deactivated (opened or turned "OFF") to configure the directional coupler 700 to have frequency response #1 in mode 1 previously described. The additional switches S1-S4 shown in the directional coupler circuit 702 in FIG. 7 can be controlled as described above in regard to the directional coupler 300 in FIG. 3 to control the forward or reverse operation of the directional coupler 700 in FIG. 7.

Figure 9:
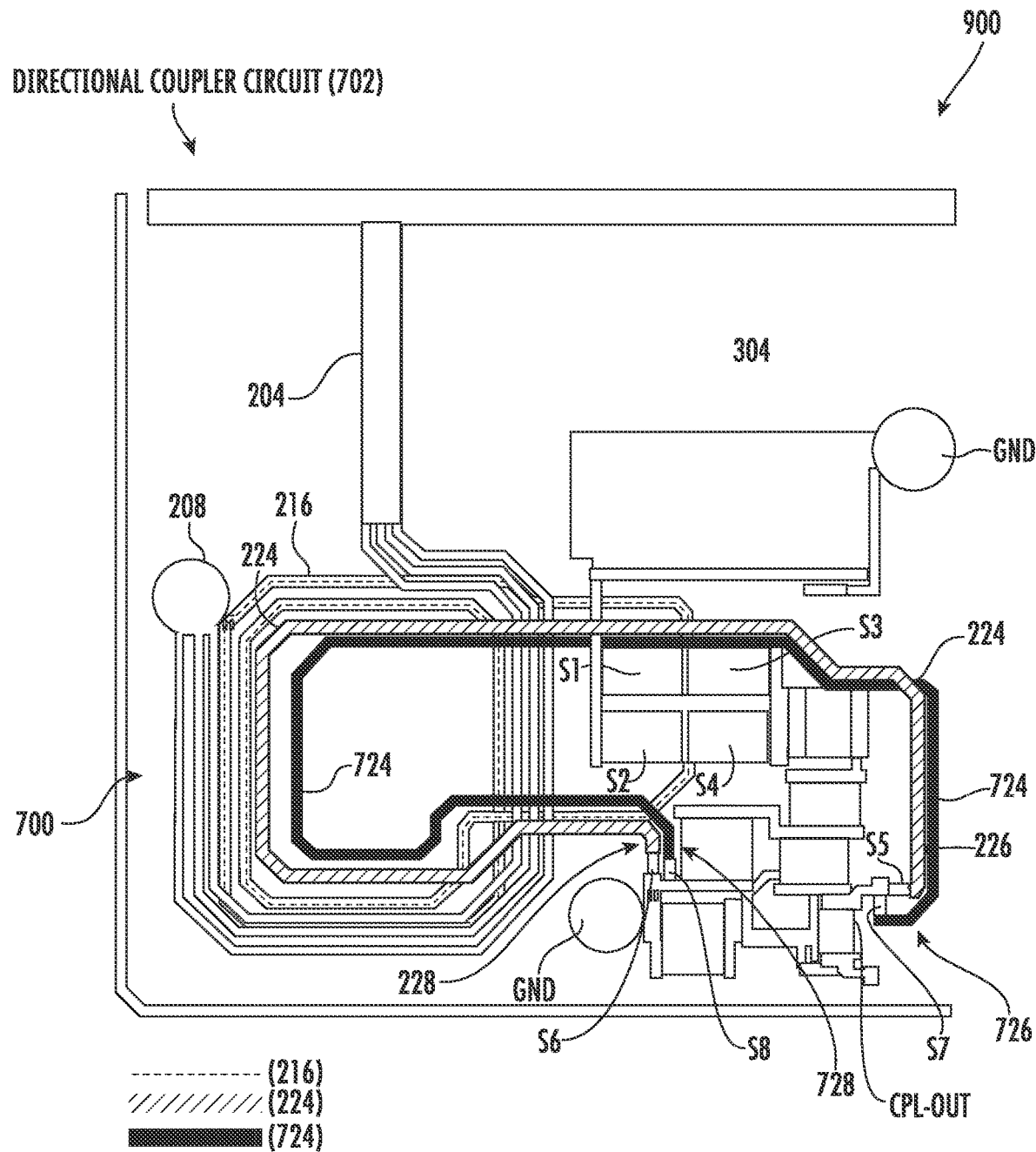
FIG. 9 is an exemplary circuit layout diagram illustrating an exemplary layout of circuit components of the directional coupler in FIG. 7.

FIG. 9 is an exemplary circuit layout 900 illustrating an exemplary layout of the directional coupler circuit 702 in FIG. 7 to further illustrate an exemplary placement of the primary coupling line 216, the additional coupling line 224, and the second additional coupling line 724. As illustrated in FIG. 9, the primary coupling line 216 is laid out as metal lines in the form of a spiral shape that this partially located inside and adjacent to the main transmission line 204. The additional coupling line 224 is laid out as metal lines partially located inside and adjacent to the primary coupling line 216 so that there is mutual inductance coupling between the primary coupling line 216 and the additional coupling line 224. The second additional coupling line 724 is laid out as metal lines partially located inside and adjacent to the additional coupling line 224 so that there is mutual inductance coupling between the second additional coupling line 724 and the additional coupling line 224 and/or the primary coupling line 216. Common components between the circuit layout 900 of the directional coupler 700 in FIG. 9 and the circuit layout 600 of the directional coupler 300 in FIG. 6 are shown with common element numbers. The first end 726 of the second additional coupling line 724 is coupled to the second additional coupling port switch S7, which is coupled to the coupling output CPL_OUT. The second end 728 of the second additional coupling line 724 is coupled to the second additional isolation port switch S8, which is coupled to the isolation output GND.

Figure 10:
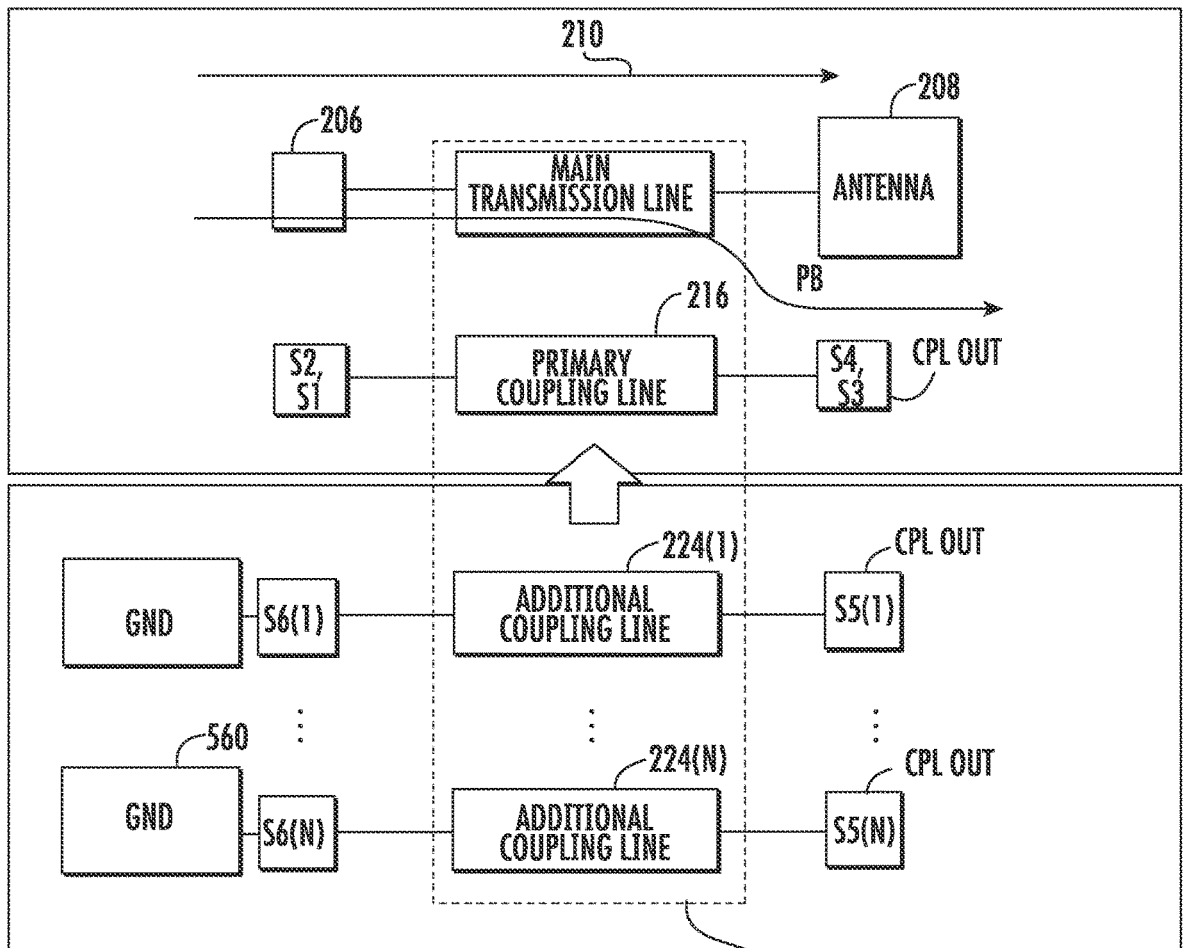
FIG. 10 is a schematic diagram of another exemplary tunable, broadband directional coupler circuit employing any number of up to 'N' additional, switchable coupling circuits to allow for selectively tuning the frequency response of the directional coupler.

FIG. 10 is a schematic diagram of another exemplary tunable, broadband directional coupler 1000 in a directional coupler circuit 1002 that employs up to 'N' additional coupling lines 224(1)-224(N), where 'N' can be any positive whole integer. The directional coupler 1000 in FIG. 10 is to illustrate that any number of additional coupling lines can be provided to couple the primary coupled RF signal 212 to allow for selectively tuning the frequency response of the directional coupler 1000. Common components between the directional coupler 1000 in FIG. 10 and the directional coupler 700 in FIG. 7 are shown with common element numbers. The additional coupling lines 224(1)-224(N) in this example each include respective additional coupling and isolation port switches S5(1)-S5(N), S6(1)-S6(N) to be able to selectively activate the additional coupling lines 224(1)-224(N) in the directional coupler circuit 1002 to control and tune the frequency response of the directional coupler 1000.

Any of the directional couplers 200, 300, 700, 1000 in FIGS. 2, 3, 7, and 10 can be provided as the directional coupler in the RF transmit circuit 100 in FIG. 1.

Figure 11:
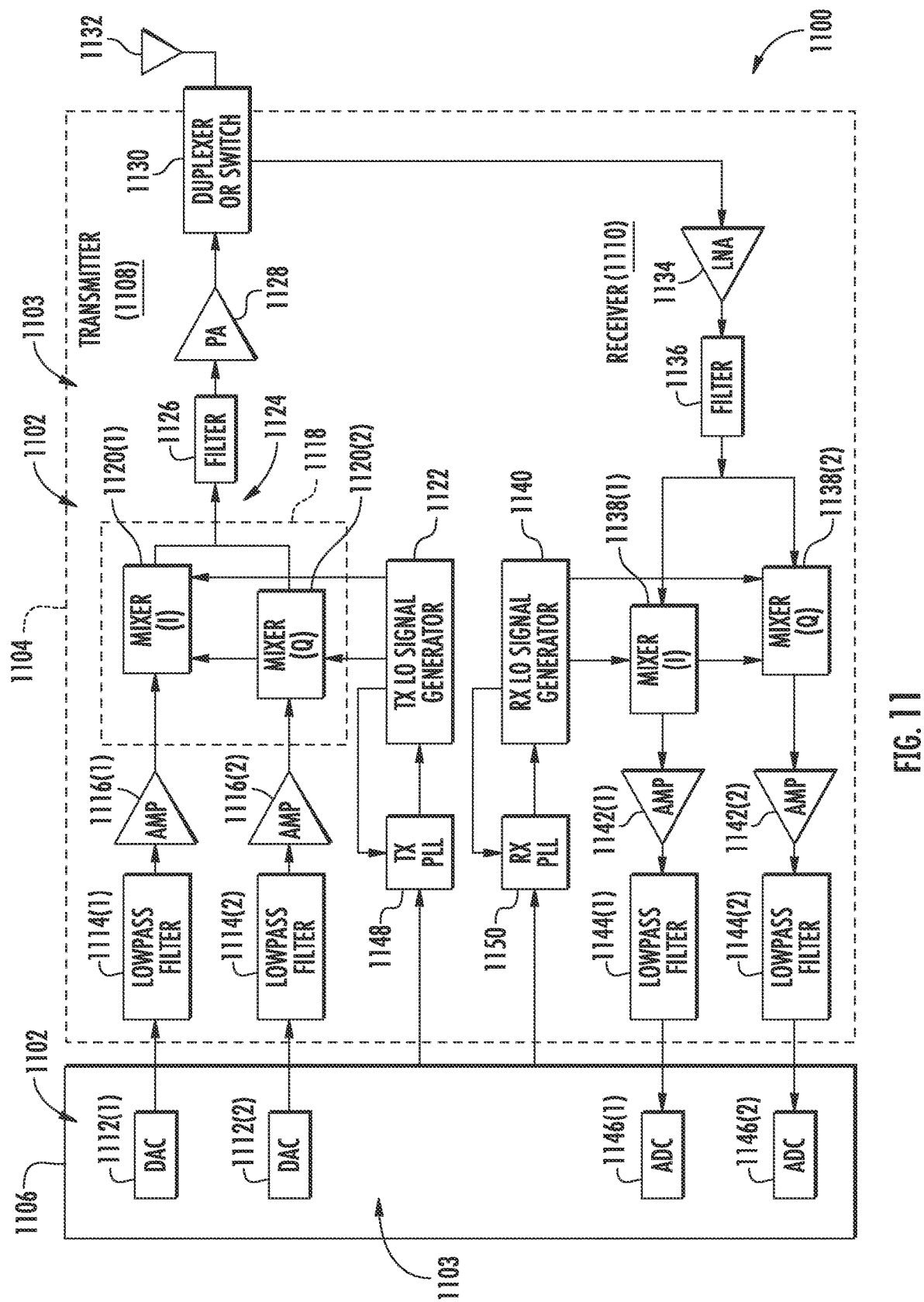
FIG. 11 is a block diagram of an exemplary wireless communications device that can include a tunable, broadband directional coupler circuit employing an additional, switchable coupling circuit(s) for controlling the frequency response of the directional coupler, including, but not limited to, the tunable, broadband directional couplers in FIGS. 2-3, 5-6, and 8-9.

FIG. 11 illustrates an exemplary wireless communications device 1100 that includes RF components formed from one or more integrated circuits (ICs) 1102, wherein any of the ICs 1102 can include tunable, broadband directional couplers and directional coupler circuits employing one or more additional, switchable coupling circuits for controlling a frequency response including, but not limited to, the directional couplers 200, 300, 700, 1000 in FIGS. 2, 3, 7, and 10, and directional coupler circuits 202, 302, 702, 1002 in FIGS. 2, 3, 7, 10. As shown in FIG. 11, the wireless communications device 1100 includes a transceiver 1104 and a data processor 1106. The data processor 1106 may include a memory to store data and program codes. The transceiver 1104 includes a transmitter 1108 and a receiver 1110 that support bi-directional communications. In general, the wireless communications device 1100 may include any number of transmitters 1108 and/or receivers 1110 for any number of communication systems and frequency bands. All or a portion of the transceiver 1104 may be implemented on one or more analog ICs, RFICs, mixed-signal ICs, etc.

The transmitter 1108 or the receiver 1110 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1100 in FIG. 11, the transmitter 1108 and the receiver 1110 are implemented with the direct-conversion architecture.

In the transmit path, the data processor 1106 processes data to be transmitted and provides I and Q analog output signals to the transmitter 1108. In the exemplary wireless communications device 1100, the data processor 1106 includes digital-to-analog converters (DACs) 1112(1), 1112(2) for converting digital signals generated by the data processor 1106 into the I and Q analog output signals, e.g., I and Q output currents, for further processing.

Within the transmitter 1108, lowpass filters 1114(1), 1114(2) filter the I and Q analog output signals, respectively, to remove undesired signals caused by the prior digital-to-analog conversion. Amplifiers (AMPs) 1116(1), 1116(2) amplify the signals from the lowpass filters 1114(1), 1114(2), respectively, and provide I and Q baseband signals. An upconverter 1118 upconverts the I and Q baseband signals with I and Q transmit (TX) local oscillator (LO) signals from a TX LO signal generator 1122 through mixers 1120(1), 1120(2) to provide an upconverted signal 1124. A filter 1126 filters the upconverted signal 1124 to remove undesired signals caused by the frequency upconversion as well as noise in a receive frequency band. A PA 1128 amplifies the upconverted signal 1124 from the filter 1126 to obtain the desired output power level and provides a transmit RF signal. The transmit RF signal is routed through a duplexer or switch 1130 and transmitted via an antenna 1132.

In the receive path, the antenna 1132 receives signals transmitted by base stations and provides a received RF signal, which is routed through the duplexer or switch 1130 and provided to a low noise amplifier (LNA) 1134. The duplexer or switch 1130 is designed to operate with a specific receive (RX)-to-TX duplexer frequency separation, such that RX signals are isolated from TX signals. The received RF signal is amplified by the LNA 1134 and filtered by a filter 1136 to obtain a desired RF input signal. Down-conversion mixers 1138(1), 1138(2) mix the output of the filter 1136 with I and Q RX LO signals (i.e., LO_I and LO_Q) from an RX LO signal generator 1140 to generate I and Q baseband signals. The I and Q baseband signals are amplified by AMPs 1142(1), 1142(2) and further filtered by lowpass filters 1144(1), 1144(2) to obtain I and Q analog input signals, which are provided to the data processor 1106. In this example, the data processor 1106 includes analog-to-digital converters (ADCs) 1146(1), 1146(2) for converting the analog input signals into digital signals to be further processed by the data processor 1106.

In the wireless communications device 1100 of FIG. 11, the TX LO signal generator 1122 generates the I and Q TX LO signals used for frequency upconversion, while the RX LO signal generator 1140 generates the I and Q RX LO signals used for frequency downconversion. Each LO signal is a periodic signal with a particular fundamental frequency. A TX phase-locked loop (PLL) circuit 1148 receives timing information from the data processor 1106 and generates a control signal used to adjust the frequency and/or phase of the TX LO signals from the TX LO signal generator 1122. Similarly, an RX PLL circuit 1150 receives timing information from the data processor 1106 and generates a control signal used to adjust the frequency and/or phase of the RX LO signals from the RX LO signal generator 1140.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are also described in the following numbered aspects:

1. A directional coupler circuit, comprising:
   a main transmission line coupled between an input port and an output port;
   a primary coupling circuit comprising a primary coupling line adjacent to the main transmission line; and
   an additional coupling circuit, comprising:
      an additional coupling line comprising a first end and a second end, the additional coupling line adjacent to the primary coupling line.

2. The directional coupler circuit of clause 1, wherein:
   the input port is configured to couple a received input radio frequency (RF) signal to the main transmission line; and
   the primary coupling line is configured to couple a portion of power of the input RF signal from the main transmission line as a primary coupled RF signal to a coupling output to provide the primary coupled RF signal of a primary frequency response.

3. The directional coupler circuit of clauses 1 to 2, wherein the additional coupling circuit further comprises:
   an additional coupling port switch coupled to the first end of the additional coupling line and the coupling output.

4. The directional coupler circuit of clause 3, wherein the additional coupling port switch is configured to be activated to couple the first end of the additional coupling line to the coupling output to provide the primary coupled RF signal of a second frequency response different from the primary frequency response.

5. The directional coupler circuit of clause 4, wherein the additional coupling line is configured to be electromagnetically (EM) coupled to the primary coupling line in response to the activation of the additional coupling port switch coupling the first end of the additional coupling line to the coupling output.

6. The directional coupler circuit of any of clauses 2 to 5, wherein the additional coupling circuit further comprises:
   an additional isolation port switch coupled to the second end of the additional coupling line and an isolation output.

7. The directional coupler circuit of clause 6, wherein the additional isolation port switch is configured to be activated to couple the second end of the additional coupling line to the isolation output to provide the primary coupled RF signal of a third frequency response different from the primary frequency response.

8. The directional coupler circuit of clause 7, wherein the additional coupling line is configured to be electromagnetically (EM) coupled to the primary coupling line in response to the activation of the additional isolation port switch coupling the second end of the additional coupling line to the isolation output.

9. The directional coupler circuit of any of clauses 1 to 8, wherein the primary coupling circuit further comprises:
   a first primary coupling port switch coupled to a first end of the primary coupling line and a coupling output;
   a first primary isolation port switch coupled to a second end of the primary coupling line and an isolation output;
   a second primary coupling port switch coupled to the second end of the primary coupling line and the coupling output; and
   a second primary isolation port switch coupled to the first end of the primary coupling line and the isolation output.

10. The directional coupler circuit of clause 9, wherein:
   the input port is configured to couple a received input radio frequency (RF) signal to the main transmission line;
   the primary coupling line is configured to couple a portion of power of the input RF signal from the main transmission line as a primary coupled RF signal;
   the first primary coupling port switch is configured to be activated to couple the first end of the primary coupling line to the coupling output to provide the primary coupled RF signal of a primary frequency response; and
   the first primary isolation port switch is configured to be activated to couple the second end of the primary coupling line to the isolation output.

11. The directional coupler circuit of clause 10, wherein:
   the second primary coupling port switch is configured to be activated to couple the second end of the primary coupling line to the coupling output; and
   the second primary isolation port switch is configured to be activated to couple the first end of the primary coupling line to the isolation output.

12. The directional coupler circuit of any of clauses 10 to 11; wherein the additional coupling circuit further comprises:
   an additional coupling port switch coupled to the first end of the additional coupling line and a coupling output; and
   an additional isolation port switch coupled to the second end of the additional coupling line and an isolation output,
   wherein:
      the additional coupling port switch is configured to be deactivated to decouple the first end of the additional coupling line from the coupling output; and
      the additional isolation port switch is configured to be deactivated to decouple the second end of the additional coupling line from the isolation output.

13. The directional coupler circuit of clauses 10 to 12, wherein the additional coupling port switch is configured to be activated to couple the first end of the additional coupling line to the coupling output to provide the primary coupled RF signal of a second frequency response different from the primary frequency response.

14. The directional coupler circuit of clauses 10 to 13, wherein the additional isolation port switch is configured to be activated to couple the second end of the additional coupling line to the isolation output to provide the primary coupled RF signal of a third frequency response different from the primary frequency response.

15. The directional coupler circuit of clause 3, further comprising a second additional coupling circuit comprises:
   a second additional coupling line comprising a first end and a second end, the second additional coupling line adjacent to the additional coupling line.

16. The directional coupler circuit of clause 15, wherein the second additional coupling circuit further comprises:
   a second additional coupling port switch coupled to the first end of the additional coupling line and a coupling port.

17. The directional coupler circuit of clause 16, wherein the second additional coupling port switch is configured to be activated to couple the first end of the second additional coupling line to the coupling output.

18. The directional coupler circuit of clauses 15 to 17, wherein the second additional coupling circuit further comprises:
   a second additional isolation port switch coupled to the second end of the second additional coupling line and an isolation port.
19. The directional coupler circuit of clause 18, wherein the second additional isolation port switch is configured to be activated to couple the second end of the second additional coupling line to the isolation output.
20. The directional coupler circuit of clauses 17 to 19, wherein:
   the additional coupling port switch is configured to be activated to couple the first end of the additional coupling line to the coupling output; and
   the second additional coupling port switch is configured to be activated to couple the first end of the second additional coupling line to the coupling output.
21. The directional coupler circuit of clause 19, wherein the additional coupling line comprises:
   an additional isolation port switch coupled to the second end of the additional coupling line and the isolation output:
   wherein:
      the additional isolation port switch is configured to be activated to couple the second end of the additional coupling line to the isolation output; and
      the second additional isolation port switch is configured to be activated to couple the second end of the second additional coupling line to the isolation output.
22. The directional coupler circuit of any of clauses 1-21 integrated into an integrated circuit (IC).
23. A method of selectively tuning the frequency response of a directional coupler, comprising:
   receiving an input radio frequency (RF) signal on an input port coupled to a main transmission line;
   transmitting the received input RF signal on the main transmission line to an output port;
   coupling a portion of power of the input RF signal as a coupled RF signal from the main transmission line to a primary coupling line adjacent to the main transmission line to provide a primary coupled RF signal of a primary frequency response; and
   activating an additional coupling line adjacent to the primary coupling line to couple a portion of the coupled RF signal to the additional coupling line to provide an additional coupled RF signal of a second frequency response different from the primary frequency response.
24. The method of clause 23; wherein activating the additional coupling line comprises activating an additional coupling port switch coupled to a first end of the additional coupling line and a coupling port, to couple the portion of the coupled RF signal to the additional coupling line, to provide the additional coupled RF signal of the second frequency response different from the primary frequency response.
25. The method of any of clauses 23 to 24, wherein activating the additional coupling line comprises activating an additional isolation port switch to couple to a second end of the additional coupling line and an isolation output, to couple the portion of the coupled RF signal to the additional coupling line, to provide the additional coupled RF signal of a third frequency response different from the primary frequency response.
26. The method of any of clauses 23 to 25, further comprising deactivating the additional coupling line to decouple the portion of the coupled RF signal from the additional coupling line, to provide the primary coupled RF signal of the primary frequency response.
27. The method of any of clauses 23 to 26, further comprising activating a second additional coupling line adjacent to the additional coupling line to couple a portion of the additional coupled RF signal to the second additional coupling line to provide a second additional coupled RF signal of a third frequency response different from the primary, frequency response and the second frequency response.
28. The method of clause 27, further comprising not activating the additional coupling line.
29. The method of any of clauses 27 to 28, further comprising deactivating the second additional coupling line to decouple the portion of the additional coupled RF signal from the second additional coupling line to provide the additional coupled RF signal of the second frequency response.
30. A radio frequency (RF) transmit circuit, comprising:
   a power amplifier (PA) circuit, comprising:
      a PA input configured to receive an input RF signal; and
      a PA output;
      the PA circuit configured to amplify the input RF signal into an amplified RF signal on the PA output;
   a matching network circuit, comprising:
      a matching network input coupled to the PA output;
      a matching network output; and
   a directional coupler circuit, comprising:
      a coupler input port coupled to the matching network output;
      a coupler output port;
      a main transmission line coupled to the coupler input port and the coupler output port;
      a primary coupling circuit comprising a primary coupling line adjacent to the main transmission line; and
      an additional coupling circuit, comprising:
         an additional coupling line comprising a first end and a second end, the additional coupling line adjacent to the main transmission line;
         an additional coupling port switch coupled to the first end of the additional coupling line and a coupling output; and
         an additional isolation port switch coupled to the second end of the additional coupling line and an isolation output.
31. The RF transmit circuit of clause 30, wherein:
   the coupler input port is configured to couple the received input RF signal to the main transmission line; and
   the primary coupling line is configured to couple a portion of power of the received input RF signal from the main transmission line as a primary coupled RF signal to the coupling output to provide a primary frequency response for the primary coupled RF signal.
32. The RF transmit circuit of clause 31, wherein the additional coupling port switch is configured to be activated to couple the first end of the additional coupling line to the coupling output to provide a second frequency response for the primary coupled RF signal different from the primary frequency response.
33. The RF transmit circuit of any of clauses 31 to 32, wherein the additional isolation port switch is configured to be activated to couple the second end of the additional coupling line to the isolation output to provide a third frequency response for the primary coupled RF signal different from the primary frequency response.

What is claimed is:

1. A directional coupler circuit, comprising:
a main transmission line coupled to an input port and an output port;
a primary coupling circuit comprising a primary coupling line adjacent to the main transmission line, the primary coupling line comprising a coupling output; and
an additional coupling circuit, comprising:
an additional coupling line adjacent to the primary coupling line; and
an additional coupling port switch connected to the additional coupling line and the coupling output.

2. The directional coupler circuit of claim 1 integrated into an integrated circuit (IC).

3. The directional coupler circuit of claim 1, wherein:
the input port is configured to couple a received input radio frequency (RF) signal to the main transmission line; and
the primary coupling line is configured to couple a portion of power of the input RF signal from the main transmission line as a primary coupled RF signal to the coupling output to provide the primary coupled RF signal of a primary frequency response.

4. The directional coupler circuit of claim 3, wherein the additional coupling circuit further comprises:
an additional isolation port switch coupled to the additional coupling line and an isolation output.

5. The directional coupler circuit of claim 4, wherein the additional isolation port switch is configured to be activated to couple the additional coupling line to the isolation output to provide the primary coupled RF signal of a third frequency response different from the primary frequency response.

6. The directional coupler circuit of claim 5, wherein the additional coupling line is configured to be electromagnetically (EM) coupled to the primary coupling line in response to the activation of the additional isolation port switch coupling the additional coupling line to the isolation output.

7. The directional coupler circuit of claim 1, wherein the additional coupling port switch is configured to be activated to connect the additional coupling line to the coupling output to provide the primary coupled RF signal of a second frequency response different from the primary frequency response.

8. The directional coupler circuit of claim 7, wherein the additional coupling line is configured to be electromagnetically (EM) coupled to the primary coupling line in response to the activation of the additional coupling port switch connecting the additional coupling line to the coupling output.

9. The directional coupler circuit of claim 1, wherein the primary coupling circuit further comprises:
a first primary coupling port switch coupled to the primary coupling line and the coupling output;
a first primary isolation port switch coupled to the primary coupling line and an isolation output;
a second primary coupling port switch coupled to the primary coupling line and the coupling output; and
a second primary isolation port switch coupled to the primary coupling line and the isolation output.

10. The directional coupler circuit of claim 9, wherein:
the second primary coupling port switch is configured to be activated to couple the primary coupling line to the coupling output; and
the second primary isolation port switch is configured to be activated to couple the primary coupling line to the isolation output.

11. The directional coupler circuit of claim 9, wherein:
the input port is configured to couple a received input radio frequency (RF) signal to the main transmission line;
the primary coupling line is configured to couple a portion of power of the input RF signal from the main transmission line as a primary coupled RF signal;
the first primary coupling port switch is configured to be activated to couple the primary coupling line to the coupling output to provide the primary coupled RF signal of a primary frequency response; and
the first primary isolation port switch is configured to be activated to couple the primary coupling line to the isolation output.

12. The directional coupler circuit of claim 11, wherein the additional coupling circuit further comprises:
an additional isolation port switch coupled to the second end of the additional coupling line and the isolation output,
wherein:
the additional coupling port switch is configured to be deactivated to disconnect the additional coupling line from the coupling output; and
the additional isolation port switch is configured to be deactivated to decouple the additional coupling line from the isolation output.

13. The directional coupler circuit of claim 11, wherein the additional coupling port switch is configured to be activated to connect the additional coupling line to the coupling output to provide the primary coupled RF signal of a second frequency response different from the primary frequency response.

14. The directional coupler circuit of claim 11, wherein the additional isolation port switch is configured to be activated to couple the additional coupling line to the isolation output to provide the primary coupled RF signal of a third frequency response different from the primary frequency response.

15. The directional coupler circuit of claim 1, further comprising a second additional coupling circuit comprises:
a second additional coupling line adjacent to the additional coupling line.

16. The directional coupler circuit of claim 15, wherein the second additional coupling circuit further comprises:
a second additional coupling port switch coupled to the additional coupling line and the coupling port.

17. The directional coupler circuit of claim 16, wherein the second additional coupling port switch is configured to be activated to couple the second additional coupling line to the coupling output.

18. The directional coupler circuit of claim 17, wherein:
the additional coupling port switch is configured to be activated to connect the additional coupling line to the coupling output; and
the second additional coupling port switch is configured to be activated to couple the second additional coupling line to the coupling output.

19. The directional coupler circuit of claim 15, wherein the second additional coupling circuit further comprises:
a second additional isolation port switch coupled the second additional coupling line and an isolation output.

20. The directional coupler circuit of claim 19, wherein the second additional isolation port switch is configured to be activated to couple the second additional coupling line to the isolation output.

21. The directional coupler circuit of claim 20, wherein the additional coupling line comprises:

an additional isolation port switch coupled to the additional coupling line and the isolation output:

wherein:
the additional isolation port switch is configured to be activated to couple the additional coupling line to the isolation output; and
the second additional isolation port switch is configured to be activated to couple the second additional coupling line to the isolation output.

22. A radio frequency (RF) transmit circuit, comprising:
a power amplifier (PA) circuit, comprising:
 a PA input configured to receive an input RF signal; and
 a PA output;
 the PA circuit configured to amplify the input RF signal into an amplified RF signal on the PA output;
a matching network circuit, comprising:
 a matching network input coupled to the PA output;
 a matching network output; and
a directional coupler circuit, comprising:
 a coupler input port coupled to the matching network output;
 a coupler output port;
 a main transmission line coupled to the coupler input port and the coupler output port;
 a primary coupling circuit comprising a primary coupling line adjacent to the main transmission line; and
 an additional coupling circuit, comprising:
  an additional coupling line adjacent to the main transmission line;
  an additional coupling port switch coupled to the additional coupling line and a coupling output; and
  an additional isolation port switch coupled to the additional coupling line and an isolation output.

23. The RF transmit circuit of claim 22, wherein:
the coupler input port is configured to couple the received input RF signal to the main transmission line; and
the primary coupling line is configured to couple a portion of power of the received input RF signal from the main transmission line as a primary coupled RF signal to the coupling output to provide a primary frequency response for the primary coupled RF signal.

24. The RF transmit circuit of claim 23, wherein the additional coupling port switch is configured to be activated to couple the additional coupling line to the coupling output to provide a second frequency response for the primary coupled RF signal different from the primary frequency response.

25. The RF transmit circuit of claim 23, wherein the additional isolation port switch is configured to be activated to couple the additional coupling line to the isolation output to provide a third frequency response for the primary coupled RF signal different from the primary frequency response.

26. A method of selectively tuning the frequency response of a directional coupler, comprising:
receiving an input radio frequency (RF) signal on an input port coupled to a main transmission line;
transmitting the received input RF signal on the main transmission line to an output port;
coupling a portion of power of the input RF signal as a coupled RF signal from the main transmission line to a primary coupling line adjacent to the main transmission line to provide a primary coupled RF signal of a primary frequency response; and
activating an additional coupling line adjacent to the primary coupling line to couple a portion of the coupled RF signal to the additional coupling line to provide an additional coupled RF signal of a second frequency response different from the primary frequency response.

27. The method of claim 26, wherein activating the additional coupling line comprises activating an additional coupling port switch coupled to the additional coupling line and a coupling port, to couple the portion of the coupled RF signal to the additional coupling line, to provide the additional coupled RF signal of the second frequency response different from the primary frequency response.

28. The method of claim 26, wherein activating the additional coupling line comprises activating an additional isolation port switch to couple to the additional coupling line and an isolation output, to couple the portion of the coupled RF signal to the additional coupling line, to provide the additional coupled RF signal of a third frequency response different from the primary frequency response.

29. The method of claim 26, further comprising deactivating the additional coupling line to decouple the portion of the coupled RF signal from the additional coupling line, to provide the primary coupled RF signal of the primary frequency response.

30. The method of claim 26, further comprising activating a second additional coupling line adjacent to the additional coupling line to couple a portion of the additional coupled RF signal to the second additional coupling line to provide a second additional coupled RF signal of a third frequency response different from the primary frequency response and the second frequency response.

31. The method of claim 30, further comprising not activating the additional coupling line.

32. The method of claim 30, further comprising deactivating the second additional coupling line to decouple the portion of the additional coupled RF signal from the second additional coupling line to provide the additional coupled RF signal of the second frequency response.

* * * * *